US006236252B1

(12) United States Patent
Genest et al.

(10) Patent No.: US 6,236,252 B1
(45) Date of Patent: May 22, 2001

(54) LOW-NOISE CURRENT PULSE GENERATOR DEVICE

(75) Inventors: Pierre Genest, Butry sur Oise; Fuji Yang, Clichy, both of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/236,114

(22) Filed: Jan. 25, 1999

(30) Foreign Application Priority Data

Jan. 26, 1998 (FR) .................................................. 98 00766

(51) Int. Cl.[7] ..................................................... H03K 3/013
(52) U.S. Cl. .......................... 327/178; 327/108; 327/172
(58) Field of Search ..................................... 327/172, 384, 327/108, 581, 538, 540, 178; 323/315

(56) References Cited

U.S. PATENT DOCUMENTS 4,866,368 * 9/1989 Bird ..................................... 323/316
5,028,822 * 7/1991 Hughes ................................ 327/581
5,179,301 * 1/1993 Hughes ................................ 327/335
6,021,162 * 2/2000 Gaboury et al. .

* cited by examiner

*Primary Examiner*—Timothy P. Callahan
*Assistant Examiner*—Terry L. Englund
(74) *Attorney, Agent, or Firm*—Sughrue, Mion, Zinn, Macpeak & Seas, PLLC

(57) ABSTRACT

A current pulse generator device includes current pulse generator circuits and polarizer circuits. It further includes holding circuits for holding the polarization voltage connected to the generator circuits, the holding circuits connected via switch circuits to the polarizer circuits. The switch circuits can assume in succession a closed or adjustment position in which they connect the holding circuits to the polarizer circuits, and an open or operating position in which they isolate the holding circuits from the polarizer circuits so that the generator circuits generate at least one low-noise current pulse. The device can be used in a phase comparator and a radiocommunication terminal, and the phase comparator can be used in a synthesiser.

11 Claims, 3 Drawing Sheets

LOW-NOISE CURRENT PULSE GENERATOR DEVICE

BACKGROUND OF THE INVENTION

1. Field of the Invention

The field of the invention is that of devices for generating current pulses, also known as charging pumps.

To be more precise, the invention concerns a low-noise device for generating current pulses.

The invention applies in particular, although not exclusively, to generating low-noise current pulses for a phase comparator included in a synthesizer of a radiocommunication terminal.

2. Description of the Prior Art

A device of the above type generally comprises current pulse generator means cooperating with polarizer means. The polarizer means supply a polarization voltage to the current pulse generator means.

There are two major families of current pulse generator devices according to the basic structure formed by the polarizer means and the current pulse generator means. The basic structure is either of the switched current mirror type or of the cascode current source type.

A switched current mirror current pulse generator device generally generates current pulses by switching switch means $\phi$ and $\overline{\phi}$ (see FIG. 1) at a frequency depending on the required frequency of the pulses. A current pulse is generated in two successive phases. In a first phase the switch means $\phi$ are closed and the switch means $\overline{\phi}$ are open to cause current to flow to the output (at the source of the transistor of the current pulse generator means). In this first type of device the algebraic value of the current corresponds to that of the current leaving the source of the transistor of the polarizer means. In a second phase the switch means $\phi$ are open and the switch means $\overline{\phi}$ are closed to prevent the flow of current. To generate a stream of current pulses the two phases are repeated at a frequency equal to that required for the output current pulses and corresponding to that imposed by the opening and closing of the switch means.

The cascode current source current pulse generator device generates current pulses by switching the switch means $\overline{\phi}$ alone (see FIG. 2) at a frequency depending on the required frequency of the pulses. In a first phase the switch means $\overline{\phi}$ are open allowing current to flow at the output (at the source of the cascode transistor). During a second phase the switch means $\overline{\phi}$ are closed to prevent the flow of current at the output. To generate a stream of current pulses the two phases are repeated, as in the first type of device, at a frequency equal to the required frequency of the output current pulses and corresponding to that imposed by the switching.

However, the polarizer means of the above two types of current pulse generator devices generate undesirable noise. The components of the polarizer means do not exhibit ideal behavior and therefore generate noise. Such noise (in particular that due to the current source or sources and that due to the imperfections of the various components of the polarizer means) is recovered by the current pulse generator means and also transmitted on the output side of those means, possibly amplified.

Also the polarizer means are subject to power supply rejection that is equally problematic. Insufficient power supply rejection disturbs the operation of most of the components on the output side of the polarizer means.

A prior art solution aimed at reducing noise consists in isolating the power supplies of the system using them. A solution of this kind is not satisfactory because it is not readily compatible with an integrated system. There remain high levels of coupling within the system, generating interference.

Another prior art solution is to use a low charge injection logic circuit. This solution is also relatively disadvantageous because it is not readily compatible with a system whose overall size is to be reduced. A low charge injection logic circuit of the above kind necessitates the addition of new components.

One objective of the present invention is to alleviate the various drawbacks of the prior art.

To be more precise, one objective of the present invention is to provide a current pulse generator device which can be integrated into the system using it.

An additional objective of the invention is to provide a device of the above kind that strongly reduces or even eliminates the various kinds of noise generated by the polarizer means.

Another objective of the invention is to provide a device of the above kind that is simple to manufacture.

An additional objective is to provide a device of the above kind optimizing the costs of manufacture.

SUMMARY OF THE INVENTION

The above objectives, together with others that will become apparent hereinafter, are achieved in accordance with the invention by means of a current pulse generator device comprising current pulse generator means and polarizer means supplying a polarization voltage to said generator means wherein said device further comprises maintaining means for maintaining said polarization voltage to said generator means said maintaining means connected via switch means to said polarizer means, where said switch means can assume the following two positions in succession:

a closed or adjustment position in which said switch means connect said maintaining means to said polarizer means so that said maintaining means acquire said polarization voltage supplied by said polarizer means, and an open or operating position in which said switch means isolate said maintaining means from said polarizer means, said maintaining means supplying to said generator means said previously acquired polarization voltage so that said generator means generate at least one low-noise current pulse.

The general principle of the invention is therefore based on isolating the polarizer means from the current pulse generator means when a pulse must be generated.

In other words, transmission of the noise generated by the polarizer means is prevented.

In this way the invention proposes a simple architecture that can easily be integrated into the system using it.

Note that the introduction of the maintaining and switch means is relatively low in cost.

Said polarizer means and said generator means advantageously together form a basic structure constituting either a switched current mirror or a cascode current source.

Thus the present invention can be implemented using the two major families of current pulse generator devices.

In an advantageous variant of the invention said basic structure is duplicated so that positive pulses and/or negative pulses can be generated. Clearly the present invention can be put into practice regardless of modifications known in themselves made to the basic structures.

In a first preferred embodiment of the invention said maintaining means comprise at least one capacitive component.

In a second preferred embodiment of the invention said maintaining means comprise in part the gate capacitance of an MOS transistor in said generator means.

Compared to the first embodiment, this feature has the advantage of not requiring any additional component for a cascode current source type basic structure.

Said switch means advantageously comprise at least one switching transistor.

Clearly any switching device known in itself can be used.

In one particular embodiment of the invention said switch means further comprise at least one filter resistor shunting said at least one switching transistor.

The resistor shunting the switching transistor therefore cooperates with the capacitive component of the maintaining means to filter the noise.

This feature also reduces the number of pulses required to reach the required amplitude of the current. In other words, it enables faster starting. When an MOS (metal oxide semiconductor) transistor is used as the switch means, spurious components of the transistor prevent ideal switching. The resistor shunting the switching transistor alleviates the greater part of the effects of such spurious components.

This also enables a single acquisition and therefore a single adjustment phase.

The invention also concerns a phase comparator comprising a current pulse generator device in accordance with the invention as defined hereinabove.

The present invention further concerns a synthesizer comprising a phase comparator in accordance with the invention as defined hereinabove.

A current pulse generator device in accordance with the invention can be used in a radiocommunication terminal, said switch means of said device assuming:

- said operating position when said terminal is in a transmit and/or receive phase; or
- said adjustment position when terminal is in an inactive phase.

The terminal, having a rest phase and an active phase, can use the low-noise current pulse generator device of the invention.

The rest phase is advantageously used for the maintaining means to acquire the polarization voltage with the switch means in the closed position. The active phase benefits from the isolation of the maintaining means from the polarizer means with the switch means in the open position.

Other features and advantages of the invention will become apparent on reading the following description of two preferred embodiments of the invention given by way of non-limiting and illustrative examples only and from the accompanying drawings.

DETAILED DESCRIPTION OF THE PREFERRED EMBODIMENTS

Thus the invention concerns a current pulse generator device that significantly reduces the effect of the various kinds of noise generated by the polarizer means, in particular the effect on the system using the device.

Figure 1:
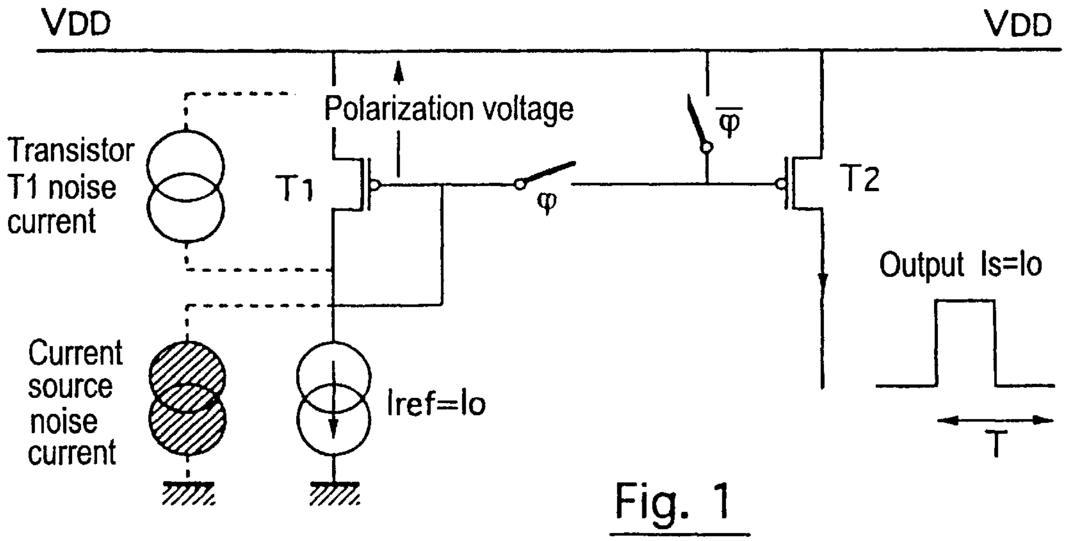
Fig. 1 PRIOR ART
FIGS. 1 and 2 each show a prior art current pulse generator device, respectively of the switched current mirror type (FIG. 1) and the cascode current source type (FIG. 2).
Figure 2:
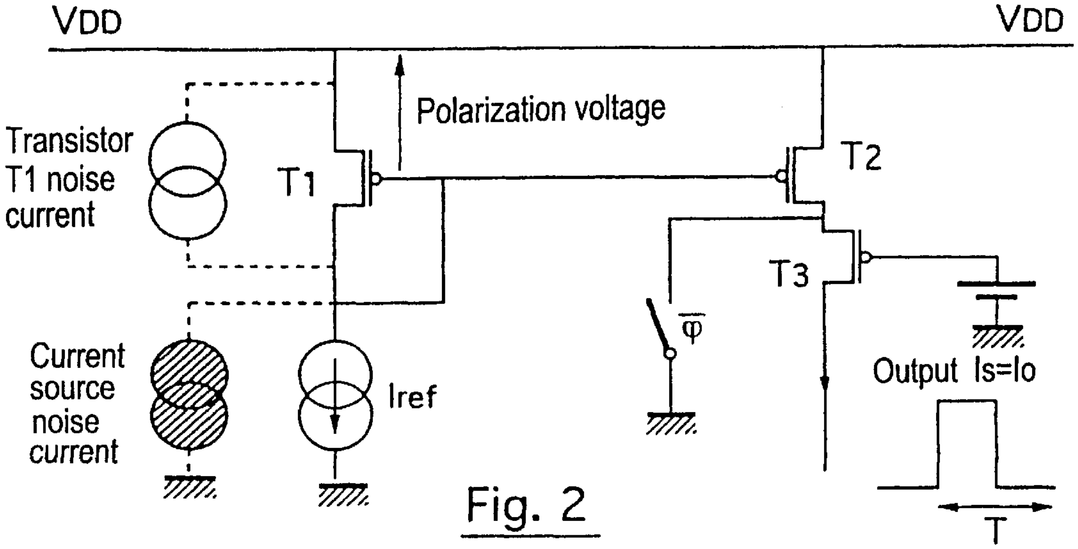
Fig. 2 PRIOR ART
Figure 3:
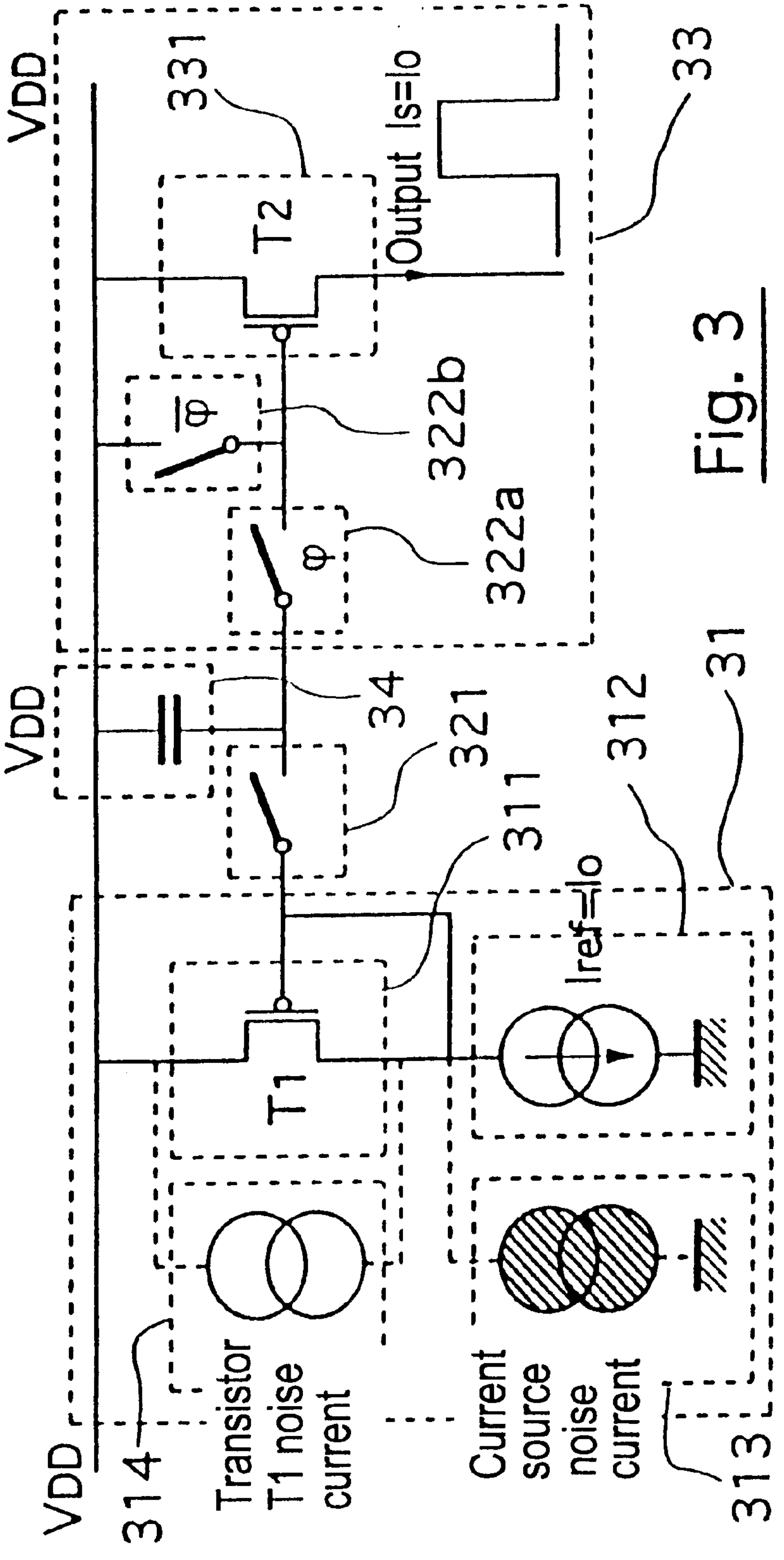
FIG. 3 is a simplified block diagram of a first particular embodiment of a current pulse generator device in accordance with the invention.

A first embodiment of a current pulse generator device in accordance with the invention will now be described with reference to FIG. 3.

In the conventional way a current pulse generator device comprises polarizer means 31 and current pulse generator means 33. The polarizer means 31 deliver a polarization voltage to the current pulse generator means 33 via switch means 321. In this first embodiment of a current pulse generator device the polarizer means 31 and the generator means 33 together form a switched current mirror basic structure.

Also in a conventional way, the polarizer means 31 comprise current source means 311 and a current source 312. The current source means 311 can be an MOS transistor $T_1$ the source of which is connected to the supply voltage $V_{DD}$, the gate of which is connected to the switch means 321 and the drain of which is connected to the current source 312. These components, namely the transistor $T_1$ and the current source 312, have spurious components which generate a spurious current. Thus the transistor $T_1$ generates a transistor $T_1$ noise current source 314 and the current source 312 generates a current source 312 noise current source 313.

Also in the conventional way, the generator means 33 comprise current source means 331 and switch means **322*a*, 322*b*. The current source means 331 can be a voltage-controlled MOS transistor $T_2$. When the switch means 322*a*, 322*b* are respectively closed and open, a polarization voltage is present at the input (i.e. at the gate of the transistor $T_2$); the transistor $T_2$ is turned on and the current flowing out of the source of the transistor $T_2$ is therefore equal in amplitude to the current flowing through the source of the transistor $T_1$ of the polarizer means 31. Conversely, when the switch means 322*a*, 322*b* are respectively open and closed, the supply voltage $V_{DD}$ is present at the input (at the gate of the transistor $T_2$); the transistor $T_2$ is turned off and no current flows out of the drain of the transistor $T_2$. In this way the switch means 322*a*, 322*b*** are alternately closed and open to generate a stream of current pulses.

In accordance with the invention the current pulse generator device further comprises polarization voltage maintaining means 34 connected to the generator means 33 and connected via switch means 321 to the polarizer means 31. The switch means 321 can occupy the following two positions in succession:

- a closed or adjustment position in which they connect the maintaining means 34 to the polarizer means 31 so that the maintaining means 34 acquire the polarization voltage supplied by the polarizer means 31;
- an open or operating position in which they isolate the maintaining means 34 from the polarizer means 31, the maintaining means 34 supplying to the generator means 33 the previously acquired polarization voltage so that the generator means 33 generate at least one low-noise current pulse.

In this way, in the adjustment phase (i.e. when the switch means 321 are in the closed position) the maintaining means 34 write and retain in memory the polarization voltage. The polarization voltage is used to control the current pulse generator means 33. When the maintaining means 34 apply the polarization voltage to the input of the transistor $T_2$ an output current appears at the drain of the transistor $T_2$. This generates a current pulse.

When the switch means 321 are in the open position, the maintaining means 34 and the generator means 33 are disconnected from the polarizer means. 31. In this way the generator means 33 can generate one or more current pulses that are not subject to noise from the transistor $T_1$ and from the current source noise current sources 313 and 314.

When the switch means 322*a*, 322*b* respectively close and open, the supply voltage is supplied as input to the gate of the transistor $T_2$ which is turned off and prevents current flowing. In other words, the drain current of the transistor $T_2$ is canceled and the output current is zero. This operation is maintained by virtue of the alternate switching of the switch means 322*a* and 322*b* at the required frequency of the current pulses.

The switch means 321, 322*a* and 322*b* advantageously each comprise a switching transistor.

It is clear that at the end of a certain time period, the maintaining means 34, being discharged, no longer have the polarization voltage at their terminals and so a refresh operation may be necessary by repeating the adjustment phase.

The maintaining means 34 advantageously comprise at least one capacitive component.

Note that the above switched current mirror type basic structure can be duplicated, in a manner known to the skilled person, to generate positive and/or negative current pulses.

Figure 4:
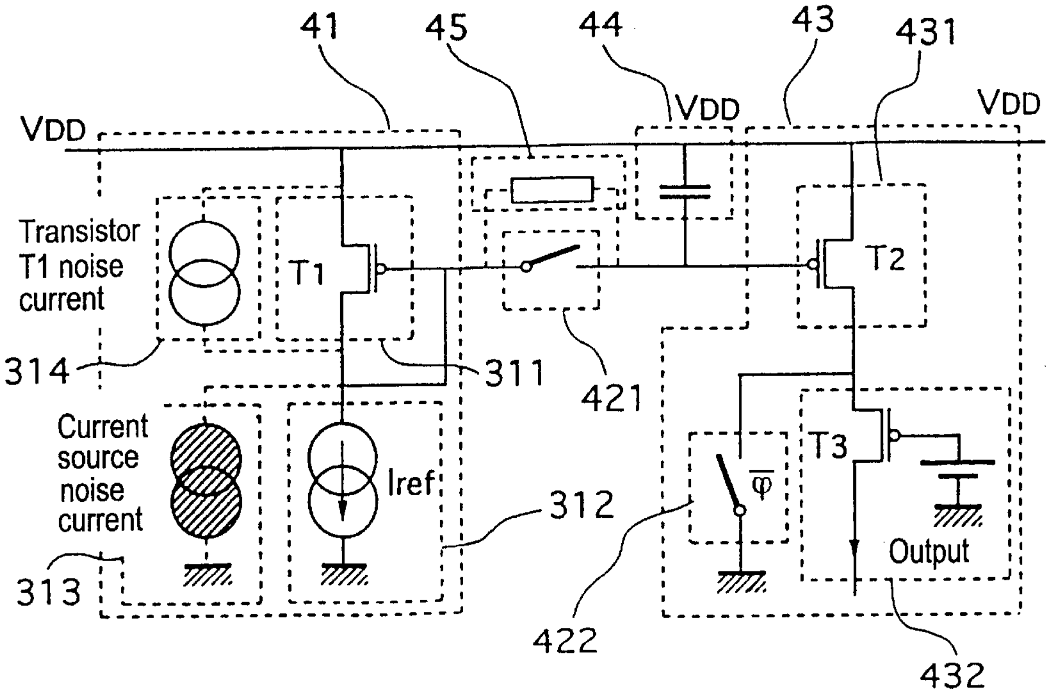
FIG. 4 is a simplified block diagram of a second particular embodiment of a current pulse generator device in accordance with the invention.

A second embodiment of a current pulse generator device in accordance with the invention will now be described with reference to FIG. 4.

In the conventional way a current pulse generator device comprises polarizer means 41 and current pulse generator means 43. The polarizer means 41 deliver a polarization voltage to the current pulse generator means 43 via switch means 421. In the second embodiment of a current pulse generator device the polarizer means 41 and the generator means 43 together form a cascode current source basic structure.

Also in a conventional way, the polarizer means 41 comprise current source means 311 and a current source 312 as described for the first embodiment. Likewise these components, namely the MOS transistor $T_1$ and the current source 312, have spurious components that respectively generate a transistor $T_1$ noise current source 314 and a current source 312 noise current source 313. However, in the second embodiment of the present invention, the gate and the drain of the transistor $T_1$ are connected together.

Still in a conventional way, the generator means 43 comprise current source means 431 and 432 and switch means 421 and 422. The current source means 431 can be a voltage-controlled MOS transistor $T_2$. Likewise, the current source means 432 can be an MOS transistor $T_3$. The gate of the transistor $T_2$ is connected to the switch means 421. The source of the transistor $T_2$ is connected to the supply voltage. The drain of the transistor $T_2$ is connected to the source of the transistor $T_3$ and to the switch means 422. The gate of the transistor $T_3$ is connected to a direct current power supply producing a polarization voltage. The output of the current pulse generation device is at the drain of the transistor $T_3$.

In accordance with the invention, the current pulse generation device further comprises means 44 for maintaining the polarization voltage connected to the generator means 43 and maintaining means connected via switch means 421 to the polarizer means 41. The switch means 421 can occupy the following two positions in succession:

- a closed or adjustment position in which they connect the maintaining means 44 to the polarizer means 41 so that the maintaining means 44 acquire the polarization voltage supplied by the polarizer means 41;
- an open or operating position in which they isolate the maintaining means 44 from the polarizer means 41, the maintaining means 44 supplying the previously acquired polarization voltage to the generator means 43 so that the generator means 43 generate at least one low-noise current pulse.

When the switch means 421 are in the closed position the maintaining means 44 store the polarization voltage applied to their terminals. In this way, once the switch means 421 are in the open position, the polarization voltage at the terminals of the maintaining means 44 is applied to the input of the transistor $T_2$. As a result the transistor $T_2$ allows the output current to flow at the drain of the transistor $T_2$. The gate of the transistor $T_3$ being connected to the polarization voltage, when the switch means 422 are open, the transistor $T_3$ is turned on. This causes an increase in the output current at the drain of the transistor $T_3$. When the switch means 422 close, the transistor $T_3$ is turned off. The current therefore falls at the output.

In this way a current pulse is generated. A second current pulse is generated by a new cycle of closing and opening the switch means 422. In this way a stream of current pulses is generated in time with the switching of the switch means 422.

A basic structure of the above kind can also be duplicated, in a manner known to the skilled person, to generate positive and/or negative pulses.

As with the first embodiment of the present invention the switch means 421 and 422 comprise at least one switching transistor and the maintaining means 44 comprise at least one capacitive component. Note that the maintaining means 44 can also consist at least in part of the capacitance of the gate of the MOS transistor $T_2$ in the generator means 431. This has the advantage of saving at least one component, because there is no need to add any additional component.

Clearly, refreshing the polarization voltage at the terminals of the maintaining means 44 can be effected in particular at the time of a high discharge, for example of the capacitive component of the maintaining means 44.

Figure 5:
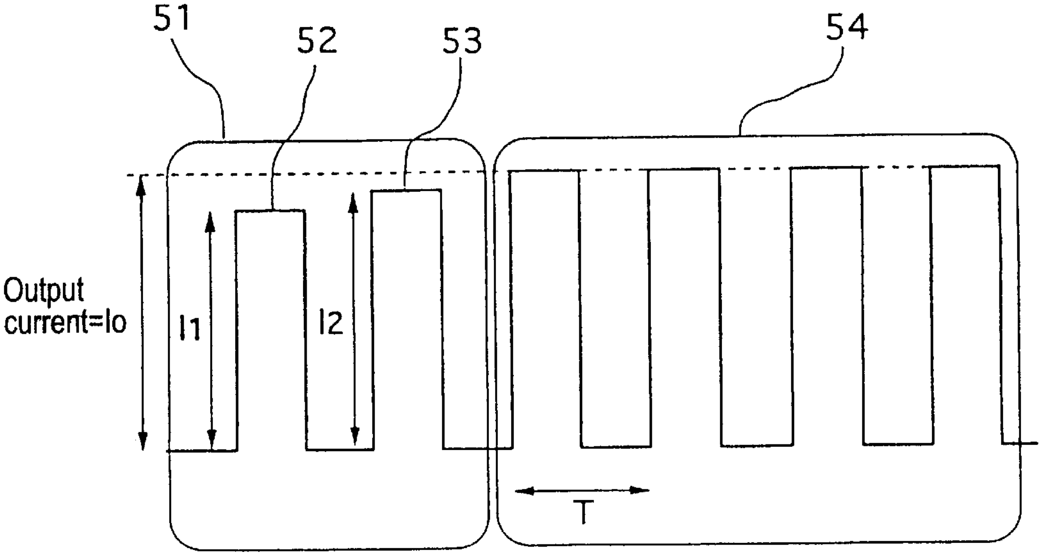
FIG. 5 is a simplified diagram showing a stream of current pulses generated by a variant of the device in accordance with the invention shown in FIG. 4.

In an advantageous variant, when the switch means 421 are in the form of a switching transistor they comprise at least one filter resistor 45 shunting the transistor. In other words the filter resistor 45 is connected between the drain and the source of the switching transistor. The association of the resistor 45 with the capacitive component of the maintaining means 44 creates a low-pass filter which filters noise generated by the noise current sources 313 and 314. The relatively low value of the resistor 45 (10 times less than that $R_{dsoff}$ of the switching transistor, for example) also reduces the value of the equivalent resistance of the two resistors in parallel. Consequently, the output current of the transistor increases more than if the filter resistor 45 were not present. This reduces the number of pulses needed to obtain a current pulse having a fixed amplitude equal to that of the current pulses of the stream of current pulses generated as shown in FIG. 5.

A stream of current pulses generated by the FIG. 4 variant (with the filter resistor 45 shunting the switch means 421) will now be described with reference to the FIG. 5 diagram.

A noise-free stream 54 of current pulses is generated by the variant previously described, for example. The stream 54 of current pulses has an amplitude $I_0$ and a period T set by the timing of the switch means 422 (see FIG. 4). A transition area 51 is needed to obtain the stream 54 of current pulses. The transition area 51 is defined by a progressive increase in the amplitudes of the current pulses in the area 51. Thus a first current pulse 52 and a second current pulse 53 have respective amplitudes $I_1$ and $I_2$ different from that $I_0$ of the established stream 54 of current pulses.

In the advantageous variant of the present invention described above (adding a resistor 45 to the switch means 421) the number of current pulses 52 and 53 needed to establish the amplitude of the stream 54 of current pulses is reduced.

A low-noise current pulse generation device in accordance with the invention can be included in the output stage of a phase comparator which is itself. part of a frequency synthesizer.

A device of the above kind in accordance with the invention can be used in a radiocommunication terminal, for example.

During an inactive phase, for example a time slot of the frame not intended for communication by the terminal (via a base station associated with the cell in which it is located), the switch means 321 or 421 can be in the adjustment (closed) position.

During an active phase, for example during a receive and/or transmit phase, the switch means 321 or 421 can be in the operating (open) position.

There is claimed:

1. A current pulse generator device comprising:

a current pulse generator that includes a switch mechanism for causing said generator to generate at least one low-noise current pulse during selected intervals;

polarizer means adapted to supply a polarization voltage to said generator;

maintaining means for maintaining said polarization voltage to said generator, said maintaining means connected via switch means to said polarizer means;

wherein said switch means assumes the following two positions in succession: an adjustment position in which said maintaining means is connected to said polarizer means so that said maintaining means acquires said polarization voltage supplied by said polarizer means; and an operating position in which said maintaining means is substantially isolated from said polarizer means and in which said maintaining means supplies said previously acquired polarization voltage to said generator so that said generator generates said at least one low-noise current pulse;

and wherein said switch means are in said operating position during said selected intervals.

2. The device claimed in claim 1, wherein said polarizer means and said generator together form a basic structure that is one of a switched current mirror basic structure and a cascode current source basic structure.

3. The device claimed in claim 2 wherein said basic structure is duplicated so that said device can generate positive pulses and/or negative pulses.

4. The device claimed in claim 1 wherein said maintaining means comprises at least one capacitive component.

5. The device claimed in claim 1 wherein said polarizer means and said generator means together form a cascode current source basic structure and said maintaining means comprises the gate capacitance of an MOS transistor of said generator.

6. The device claimed in claim 1 wherein said switch means comprises at least one switching transistor.

7. The device claimed in claim 6 wherein said switch means further comprises at least one filter resistor shunting said at least one switching transistor.

8. A phase comparator comprising a current pulse generation device as claimed in claim 1.

9. A synthesizer comprising a phase comparator as claimed in claim 8.

10. A radiocommunication terminal comprising a current pulse generation device as claimed in claim 1, said switch means of said device assuming:

said operating position if said terminal is in a transmit and/or receive phase; or said adjustment position if said terminal is in an inactive phase.

11. The device claimed in claim 1, wherein said switch mechanism causes said generator to generate a plurality of pulses during said selected intervals.

* * * * *